(12) United States Patent
Lau et al.

(10) Patent No.: US 12,000,664 B2
(45) Date of Patent: Jun. 4, 2024

(54) HEAT EXCHANGER

(71) Applicant: Eagle Technology, LLC, Melbourne, FL (US)

(72) Inventors: Chad C. Lau, Melbourne, FL (US); Clarke O. Fowler, Merritt Island, FL (US); Don S. George, Melbourne, FL (US)

(73) Assignee: Eagle Technology, LLC, Melbourne, FL (US)

( * ) Notice: Subject to any disclaimer, the term of this patent is extended or adjusted under 35 U.S.C. 154(b) by 413 days.

(21) Appl. No.: 17/464,373

(22) Filed: Sep. 1, 2021

(65) Prior Publication Data

US 2023/0069522 A1  Mar. 2, 2023

(51) Int. Cl.
*F28F 13/06* (2006.01)
*F28F 1/02* (2006.01)
*F28F 1/12* (2006.01)

(52) U.S. Cl.
CPC .............. *F28F 13/06* (2013.01); *F28F 1/022* (2013.01); *F28F 1/128* (2013.01); *F28F 2210/10* (2013.01); *F28F 2215/08* (2013.01); *F28F 2250/108* (2013.01)

(58) Field of Classification Search
CPC .. F28F 13/06; F28F 1/022; F28F 1/128; F28F 2210/10; F28F 2215/08; F28F 2250/108
USPC ........................................................ 165/177
See application file for complete search history.

(56) References Cited

U.S. PATENT DOCUMENTS

| | | | |
|---|---|---|---|
| 8,151,617 B2 * | 4/2012 | Feng ..................... | F28F 13/12 72/379.6 |
| 9,819,247 B2 * | 11/2017 | Leberle ................. | H02K 9/197 |
| 9,893,593 B2 * | 2/2018 | Sugimoto ............. | H02K 5/207 |
| 11,335,964 B2 * | 5/2022 | Fang .................... | H01M 50/204 |
| 2009/0145581 A1 * | 6/2009 | Hoffman .............. | F28F 3/14 165/80.3 |
| 2013/0189557 A1 * | 7/2013 | Haussmann ......... | H01M 10/6569 165/104.11 |
| 2016/0018167 A1 * | 1/2016 | Dziubinschi ......... | F28F 3/044 165/177 |
| 2016/0230595 A1 * | 8/2016 | Wong ................... | F28F 3/04 |
| 2022/0032211 A1 * | 2/2022 | Oshinowo ............ | B01D 17/045 |
| 2023/0069522 A1 * | 3/2023 | Lau ...................... | H01L 23/473 |

FOREIGN PATENT DOCUMENTS

EP            0207677 A1 *  1/1987
WO      2017213949 A1    12/2017

* cited by examiner

*Primary Examiner* — Claire E Rojohn, III
(74) *Attorney, Agent, or Firm* — Fox Rothschild LLP; Carol E. Thorstad-Forsyth

(57) ABSTRACT

Systems and methods for providing a fin structure. The fin structure may be employed in a heat exchanger. The fin structure comprises: a support structure; and a plurality of fins disposed on the support structure via additive manufacturing so as to facilitate a change in direction of a fluid flowing through the fin structure. The fins comprise first fins that have centers arranged in accordance with a phyllotaxis or Fibonacci pattern.

11 Claims, 16 Drawing Sheets

(a)

(b)

HEAT EXCHANGER

BACKGROUND

Statement of the Technical Field

The present disclosure relates generally to heat exchangers. More particularly, the present disclosure relates to implementing systems and methods for heat exchangers with improved heat transfer coefficients.

Description of the Related Art

Electronic chassis assemblies which include multiple circuit modules mounted in a chassis are widely used in electronic applications. An electronic chassis assembly may include a chassis configured to mechanically support the circuit modules, electrical connectors to interconnect the circuit modules, power supplies for operation of the circuit modules and one or more external connectors to connect the circuit module assembly to external equipment.

The electronic chassis assemblies may be used in military and aircraft applications. Circuit module chassis assemblies employed in such applications must be designed to operate reliably in harsh environments. Thus, these electronics chassis assemblies typically require a cooling system to remove heat generated by the circuit components and to maintain the circuit modules within a specified temperature range. Various cooling techniques are utilized, including conduction cooling, air-flow-through cooling and liquid-flow-through cooling. By way of example, conduction cooling may be used up to 70 watts heat generation, air-flow-through cooling may be used up to 250 watts heat generation, and liquid-flow-through cooling may be used up to 1000 watts heat generation. The trend is toward circuit modules which have higher speed and higher performance, but which generate larger amounts of heat.

Many liquid-flow-through heat exchangers in use today employ one or more rows of so-called flattened tubes which extend between headers provided with tanks or even tubular headers. External fins are bonded to the exterior and/or interior of the flattened tubes. Such fins increase surface area within the tubes and provide a means whereby heat may flow from the fluid flowing within the tubes to the insert and then to the walls of the tube through the insert. Thus, where the insert is a better conductor of heat than the fluid flowing within the tube, enhanced heat transfer results. In addition, such inserts may provide a turbulating function. That is to say, they increase turbulence in the fluid flowing within the tube which in turn is known to increase heat transfer efficiency. Moreover, where such tubes are to carry fluid at a relatively high pressure and are not supported by the external fins, the inserts, being bonded to both side walls, strengthen the tubes as well.

Techniques for constructing such heat exchangers include vacuum brazing. Brazing may be performed, for example, in a molten salt bath or in a vacuum furnace and requires very high temperatures (from 300° C. to 1100° C.). These high temperatures melt a brazing material, such as metals or compatible alloys (e.g. aluminum alloys), that is in contact with two or more other pieces of metal that are part of the heat exchanger. Upon cooling, the brazing material solidifies, forming a bond that thermally and physically couples the metal pieces together. The high temperature needed for brazing places limits on the heat exchangers being constructed. For example, the material used to make the heat exchanger must have a melting point higher than the brazing temperature. Moreover, the large temperature variation, from room temperature to the brazing temperature and back, require the materials that are chosen to have similar Coefficients of Thermal Expansion (CTE). If the heat exchanger was constructed from metal with a large difference in CTE, the heat exchanger could break, warp or have unwanted residual stress upon cooling to room temperature. Limitations are also put on the choice of material based on the need to reduce galvanic corrosion. Another restriction of brazing is that it typically requires special equipment, such as a molten salt bath or a vacuum furnace. Therefore, the brazing process requires purchasing expensive, specialized equipment or contracting an off-site brazing specialist, which can be both unaffordable and time-consuming, with lead times of greater than 16 weeks.

SUMMARY

The present disclosure concerns implementing systems and methods for operating a heat exchanger. The methods comprise: receiving a coolant at an inlet port of a heat exchanger; allowing the coolant to flow through the inlet port and into an internal chamber of the heat exchanger; allowing the coolant to flow in a first direction within the internal chamber; and causing a flow direction of the coolant to change from the first direction to a second different direction using first fins of a fin structure that (i) are disposed in a bend portion of the internal chamber and (ii) have centers arranged in accordance with a phyllotaxis or Fibonacci pattern. The first fins of the fins structure are formed in the internal chamber using additive manufacturing or 3D printing. The first fins may comprise curved fins.

In some scenarios, the coolant flows through second fins of the fin structure that are disposed in a first elongate leg portion of the internal chamber when the coolant flows in the first direction. The second fins are arranged in a plurality of rows and columns. Adjacent ones of the second fins are offset from each other in two directions.

In those other scenarios, the methods also comprise allowing the coolant to flow in the second different direction through the internal chamber. The coolant may flow through third fins of the fin structure that are formed in a second elongate leg portion of the internal serpentine chamber when the coolant flows in the second different direction. The second different direction can be opposed from the first direction.

In those other scenarios, the flow direction of the coolant is caused to change further using fourth fins of the fin structure that (i) are disposed in the bend portion of the internal chamber and (ii) are arranged in accordance with a concentric circle pattern. A first area of the bend portion in which the first fins are disposed is different than a second area of the bend portion in which the fourth fins are disposed. The first area may be larger than the second area. The sizes of the first and second areas may be selected based on a golden ratio, a fin arc, a fin length, a fin height, a fin thickness, a fin offset, a fin center spacing, and/or a fin spacing.

The present discloses also concerns heat exchangers. The heat exchangers comprise: a housing having an inlet port configured to receive a coolant; a chamber provided inside the housing and through which the coolant can flow in a first direction from the inlet port to a bend portion of the chamber; and a fin structure formed in the chamber and comprising first fins configured to facilitate a change in a flow direction of the coolant from the first direction to a second different direction, the first fins (i) being disposed in the bend portion of the chamber and (ii) having centers arranged in accordance with a phyllotaxis or Fibonacci pattern. The first fins may comprise curved fins.

In some scenarios, the fin structure further comprises second fins through which the coolant can flow when traveling in the first direction within a first elongate leg portion of the chamber. The second fins are arranged in a plurality of rows and columns. Adjacent ones of the second fins are offset from each other in two directions.

In those or other scenarios, the coolant can flow in the second different direction through the chamber. The fin structure further comprises third fins that are formed in a second elongate leg portion of the chamber and through which the coolant can pass when flowing in the second different direction. The second different direction may be opposed from the first direction.

In those or other scenarios, the fin structure further comprises fourth fins that (i) are disposed in the bend portion of the internal chamber, (ii) are arranged in accordance with a concentric circle pattern, and (iii) facilitate the change in the flow direction of the coolant. A first area of the bend portion in which the first fins are disposed is different than a second area of the bend portion in which the fourth fins are disposed. The first area may be larger than the second area. The sizes of the first and second areas may be selected based on a golden ratio, a fin arc, a fin length, a fin height, a fin thickness, a fin offset, a fin center spacing, and/or a fin spacing.

The present disclosure further concerns fin structures. The fin structures comprise: a support structure; and a plurality of fins disposed on the support structure via additive manufacturing so as to facilitate a change in direction of a fluid flowing through the fin structure. The fins comprise first fins that have centers arranged in accordance with a phyllotaxis or Fibonacci pattern. The first fins may comprise curved fins.

The fins may also comprise: second fins disposed on the support structure via additive manufacturing so as to facilitate flow of the fluid through the support structure in a first direction; and/or third fins disposed on the support structure via additive manufacturing so as to facilitate flow of the fluid in a second direction different from the first direction. The second and/or third fins are arranged in a plurality of rows and columns. Adjacent ones of the second and/or third fins are offset from each other in two directions.

The fins may further comprise fourth fins disposed on the support structure via additive manufacturing so as to facilitate a change in a flow direction of the fluid. The fourth fins are arranged in accordance with a concentric circle pattern. A first area of the support structure in which the first fins are disposed is different than a second area of the support structure in which the fourth fins are disposed. The first area may be larger than the second area. The sizes of the first and second areas may be selected based on a golden ratio, a fin arc, a fin length, a fin height, a fin thickness, a fin offset, a fin center spacing, and/or a fin spacing.

BRIEF DESCRIPTION OF THE DRAWINGS

The present solution will be described with reference to the following drawing figures, in which like numerals represent like items throughout the figures.

DETAILED DESCRIPTION

Figure 1:
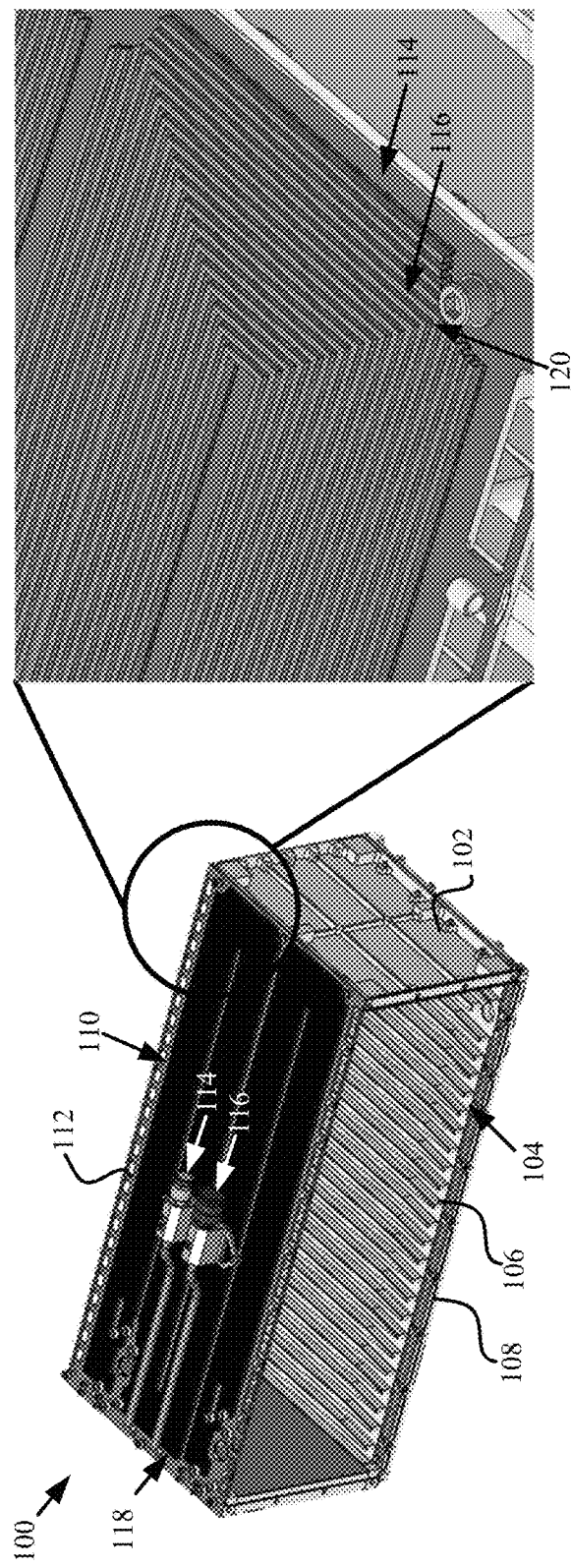
FIG. 1 provides an illustration of an illustrative electronic chassis with a heat exchanger for cooling electronic components.

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present solution may be embodied in other specific forms without departing from its spirit or essential characteristics. The described embodiments are to be considered in all respects only as illustrative and not restrictive. The scope of the present solution is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present solution should be or are in any single embodiment of the present solution. Rather, language referring to the features and advantages is understood to mean that a specific feature, advantage, or characteristic described in connection with an embodiment is included in at least one embodiment of the present solution. Thus, discussions of the features and advantages, and similar language, throughout the specification may, but do not necessarily, refer to the same embodiment.

Furthermore, the described features, advantages and characteristics of the present solution may be combined in any suitable manner in one or more embodiments. One skilled in the relevant art will recognize, in light of the description herein, that the present solution can be practiced without one or more of the specific features or advantages of a particular embodiment. In other instances, additional features and advantages may be recognized in certain embodiments that may not be present in all embodiments of the present solution.

Reference throughout this specification to "one embodiment", "an embodiment", or similar language means that a particular feature, structure, or characteristic described in connection with the indicated embodiment is included in at least one embodiment of the present solution. Thus, the phrases "in one embodiment", "in an embodiment", and similar language throughout this specification may, but do not necessarily, all refer to the same embodiment.

As used in this document, the singular form "a", "an", and "the" include plural references unless the context clearly dictates otherwise. Unless defined otherwise, all technical and scientific terms used herein have the same meanings as commonly understood by one of ordinary skill in the art. As used in this document, the term "comprising" means "including, but not limited to".

The present disclosure generally concerns systems and methods for operating a heat exchanger. The methods comprise: receiving a coolant at an inlet port of a heat exchanger; allowing the coolant to flow through the inlet port and into an internal chamber of the heat exchanger; allowing the coolant to flow in a first direction within the internal chamber; and causing a flow direction of the coolant to change from the first direction to a second different direction using first fins of a fin structure that (i) are disposed in a bend portion of the internal chamber and (ii) have centers arranged in accordance with a phyllotaxis or Fibonacci pattern. The first fins of the fins structure are formed in the internal chamber using additive manufacturing or 3D printing. The first fins may comprise curved fins.

In some scenarios, the coolant flows through second fins of the fin structure that are disposed in a first elongate leg portion of the internal chamber when the coolant flows in the first direction. The second fins are arranged in a plurality of rows and columns. Adjacent ones of the second fins are offset from each other in two directions.

In those other scenarios, the methods also comprise allowing the coolant to flow in the second different direction through the internal chamber. The coolant may flow through third fins of the fin structure that are formed in a second elongate leg portion of the internal serpentine chamber when the coolant flows in the second different direction. The second different direction can be opposed from the first direction.

In those other scenarios, the flow direction of the coolant is caused to change further using fourth fins of the fin structure that (i) are disposed in the bend portion of the internal chamber and (ii) are arranged in accordance with a concentric circle pattern. A first area of the bend portion in which the first fins are disposed is different than a second area of the bend portion in which the fourth fins are disposed. The first area may be larger than the second area. The sizes of the first and second areas may be selected based on a golden ratio, a fin arc, a fin length, a fin height, a fin thickness, a fin offset, a fin center spacing, and/or a fin spacing.

The above described methods can be implemented in a heat exchanger of the present solution. The heat exchanger comprises: a housing having an inlet port configured to receive a coolant; a chamber provided inside the housing and through which the coolant can flow in a first direction from the inlet port to a bend portion of the chamber; and a fin structure formed in the chamber and comprising first fins configured to facilitate a change in a flow direction of the coolant from the first direction to a second different direction, the first fins (i) being disposed in the bend portion of the chamber and (ii) having centers arranged in accordance with a phyllotaxis or Fibonacci pattern. The first fins may comprise curved fins.

In some scenarios, the fin structure further comprises second fins through which the coolant can flow when traveling in the first direction within a first elongate leg portion of the chamber. The second fins are arranged in a plurality of rows and columns. Adjacent ones of the second fins are offset from each other in two directions.

In those or other scenarios, the coolant can flow in the second different direction through the chamber. The fin structure further comprises third fins that are formed in a second elongate leg portion of the chamber and through which the coolant can pass when flowing in the second different direction. The second different direction may be opposed from the first direction.

In those or other scenarios, the fin structure further comprises fourth fins that (i) are disposed in the bend portion of the internal chamber, (ii) are arranged in accordance with a concentric circle pattern, and (iii) facilitate the change in the flow direction of the coolant. A first area of the bend portion in which the first fins are disposed is different than a second area of the bend portion in which the fourth fins are disposed. The first area may be larger than the second area. The sizes of the first and second areas may be selected based on a golden ratio, a fin arc, a fin length, a fin height, a fin thickness, a fin offset, a fin center spacing, and/or a fin spacing.

The present disclosure also concerns fin structures that may be employed in the heat exchanged described above. The fin structures comprise: a support structure; and a plurality of fins disposed on the support structure via additive manufacturing so as to facilitate a change in direction of a fluid flowing through the fin structure. The fins comprise first fins that have centers arranged in accordance with a phyllotaxis or Fibonacci pattern. The first fins may comprise curved fins.

The fins may also comprise: second fins disposed on the support structure via additive manufacturing so as to facilitate flow of the fluid through the support structure in a first direction; and/or third fins disposed on the support structure via additive manufacturing so as to facilitate flow of the fluid in a second direction different from the first direction. The second and/or third fins are arranged in a plurality of rows and columns. Adjacent ones of the second and/or third fins are offset from each other in two directions.

The fins may further comprise fourth fins disposed on the support structure via additive manufacturing so as to facilitate a change in a flow direction of the fluid. The fourth fins are arranged in accordance with a concentric circle pattern. A first area of the support structure in which the first fins are disposed is different than a second area of the support structure in which the fourth fins are disposed. The first area may be larger than the second area. The sizes of the first and second areas may be selected based on a golden ratio, a fin arc, a fin length, a fin height, a fin thickness, a fin offset, a fin center spacing, and/or a fin spacing.

The present solution can be employed in various applications. These applications include, but are not limited to, electronic chassis applications, avionic applications, military equipment applications, and/or ruggedized embedded system platform applications (e.g., airborne, terrestrial and maritime).

Referring now to FIG. 1, there is provided an illustration of an illustrative electronic chassis 100. The electronic chassis 100 comprises a frame 102 with slots 104 into which circuit cards can be inserted and retained. The circuit cards are not shown in FIG. 1 simply for ease of illustration. Circuit cards are well known. Still, it should be noted here that the circuit cards typically comprise a Printed Circuit Board (PCB) to which a plurality of electronic devices are coupled. The electronic devices can include, but are not limited to, processors, Integrated Circuits (ICs), sensors, data stores, resistors, capacitors, and/or inductors. During operation, the electronic devices produce heat which is transferred to the electronic chassis 100 in well-known manners (e.g., via wedge locks that are in contact with flanges 106 protruding inwardly from sidewalls 108 of the electronic chassis). This heat is transferred to a coolant flowing inside a heat exchanger 110 that is coupled to the electronic chassis 100.

The heat exchanger 110 comprises a sealed chamber 118 formed by a bottom planar structure 112 and a cover (not shown). The cover is not shown simply for ease of illustration. The cover can be defined by a top planer structure and side bars. The bottom planar structure and cover may be formed of an aluminum alloy or stainless steel. A fluid inlet port 114 and a fluid outlet port 116 are provided with the heat exchanger 110. A coolant (or cooling fluid) can travel from the fluid inlet port 114, through the chamber 118, and to the fluid outlet port 116. The coolant is heated as it travels through the chamber 118, whereby heat is transferred from the electronic chassis 100 to the heat exchanger 110. The coolant many comprise liquid Polyalphaolefin (PAO).

A fin structure 114 is disposed in the chamber 118 of the heat exchanger 110. The fin structure 114 has a dual purpose of holding the bottom planar structure 112 and cover together (thus containing pressure inside the chamber) and of forming a secondary surface for heat transfer. The secondary surface provides an improvement in the transfer of heat energy from the frame 102 of the electronic chassis 100 to the coolant.

Figure 3:
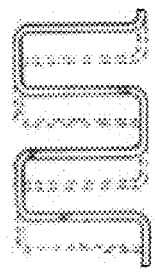
FIGS. 2-3 provide illustrations of illustrative lanced offset fins used for heat transfer of an electronic chassis.
Figure 2:
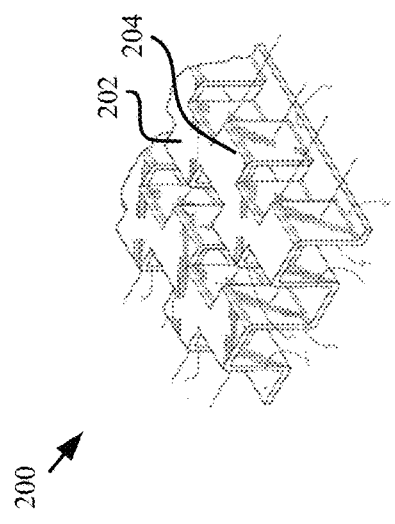

In some scenarios, the fin structure 114 has a rectangular fin architecture as shown in FIG. 1. In other scenarios, the fin structure comprises a serrated corrugation architecture 200 as shown in FIGS. 2-3. The serrated corrugation architecture 200 is defined by lanced and offset fins 202, 204. The lanced and offset fins 202, 204 can be produced using stitching machines. The lanced and offset fins 202, 204 can fail when subjected to relatively high pressures, and take a relatively long amount of time to manufacture.

The fin structure 114 provides a plurality of finned chambers inside the heat exchanger 110 and increases the heat transfer area to coolant volume ratio. The fin structure 114 may be formed of an aluminum alloy or stainless steel. The fins 116 of the fin structure 114 generally follow the shape of the chamber 118 of the heat exchanger 110. Since the chamber 118 has a serpentine shape, at least some of the fins 116 also have generally serpentine shapes with a plurality of mitered corners 120. The mitered corners 120 have ninety degree angles. As a result of these sharp corners, a direction of fluid flow changes by one hundred eighty degrees at each bend of a finned chamber (where each bend is defined by two mitered corners). The abrupt ninety degree changes in the coolant's direction of flow severely impacts the efficiency of the heat exchanger.

The present solution is designed to overcome the drawbacks of such conventional heat exchangers by providing a novel fin structure that is absent of any corners (i.e., 90 degree angles) which cause abrupt changes in the flow of the coolant through the serpentine fin chambers. The novel fin structure is formed using additive manufacturing or 3D printing from a Computer Aided Design (CAD) model or other digital 3D model. An illustration of an illustrative system implementing the novel fin structure is provided in FIG. 4.

Figure 4:
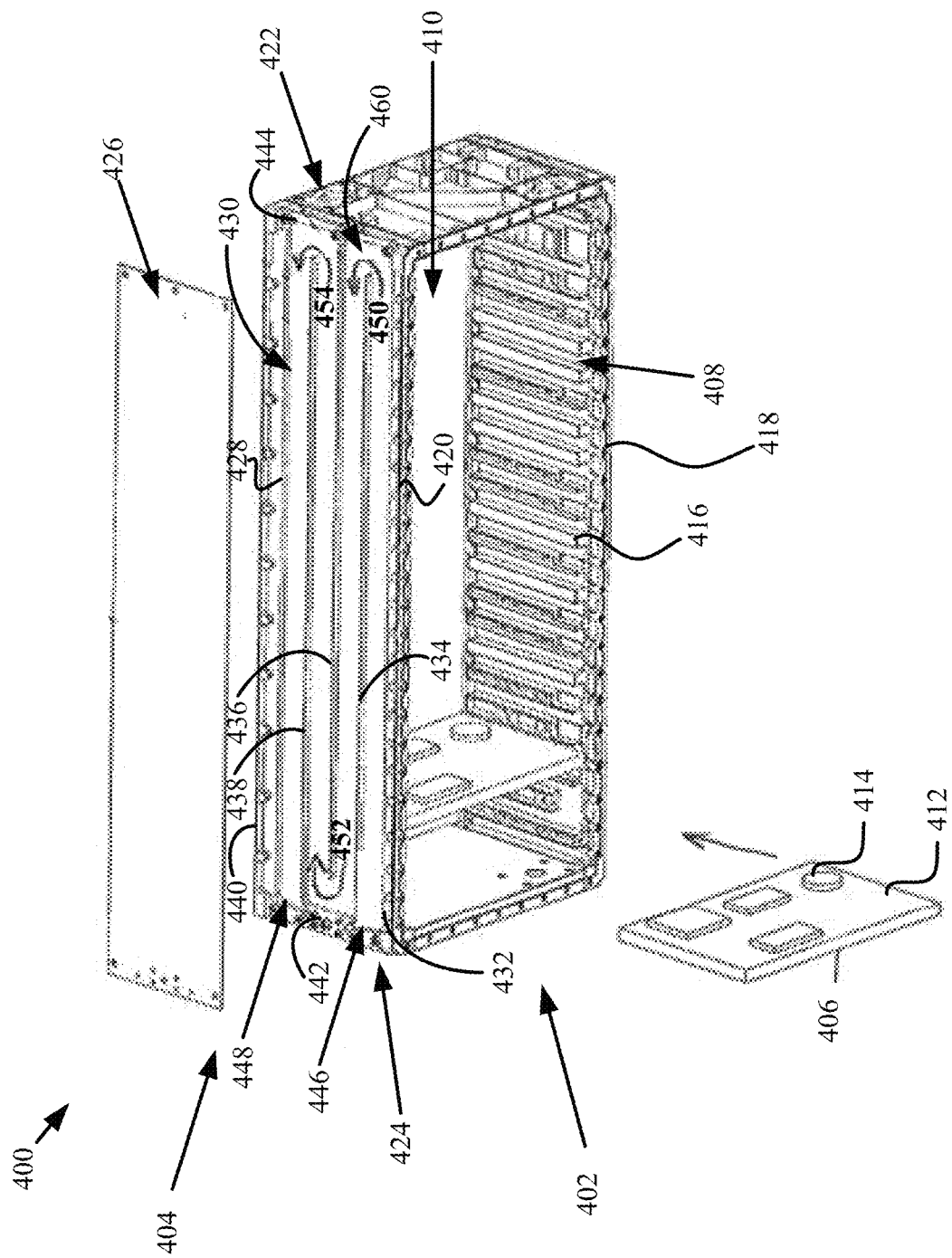
FIG. 4 provides an illustration of an illustrative system implementing the present solution.

Referring now to FIG. 4, the system 400 comprises an electronic chassis 402 and a heat exchanger 404. The electronic chassis 402 is configured to receive and retain a plurality of circuit cards 406 respectively in slots 408 of an internal space 410 of a frame 422. The frame 420 can be formed of aluminum, steel or other material. Circuit cards are well known. The circuit cards can include, but are not limited to, Printed Circuit Boards (PCBs) 412 to which a plurality of electronic devices 414 are coupled. The electronic devices 414 can include, but are not limited to, processors, ICs, sensors, data stores, resistors, capacitors, inductors, transceivers and/or antennas. During operation, the electronic devices 414 produce heat which is transferred to the frame 422 in well-known manners (e.g., via wedge locks that are in contact with flanges 416 protruding inwardly from sidewalls 418, 420 of the frame 422).

The heat exchanger 404 is provided to maintain a temperature of the electronic chassis 402 within a specified temperature range. In this regard, the heat exchanger 404 is coupled to and in contact with sidewall 420 of frame 422. This coupling can be achieved using any known coupler or coupling mechanism (e.g., screws, bolts, nuts, conductive adhesives, welds, etc.). The heat exchanger 404 comprises at least one internal chamber 430 through which a coolant (not shown) can flow. The coolant can include, but is not limited to, PAO and/or water. The internal chamber 430 is provided in a housing of the heat exchanger. The housing is at least partially defined by a bottom plate 424 and a top plate 426. The plates 424, 426 are coupled to each other via one or more coupling means (e.g., screws, nuts, bolts, adhesive, welds, etc.). The internal chamber 430 has a serpentine shape defined by walls 432, 434, 436, 438, 440, 442, 444 extending between the plates 424, 426. The walls 432-444 may be integrally formed with the bottom plate 424 via machining tools and/or molds.

The coolant is supplied to the heat exchanger 404 from a tank (not shown) via a pump (not shown). The tank and pump are not shown simply for ease of illustration. The pump is generally configured to pump or otherwise transfer coolant from the tank to the heat exchanger 404, and cause the coolant to flow through the serpentine internal chamber 430 from an inlet port 446 to an outlet port 448 of the heat exchanger 404. The coolant is heated as it flows through the internal chamber 430 of the heat exchanger 404. In this way, heat is transferred from the electronic chassis 402 to the heat exchanger 404. The coolant is then cooled and re-circulated through the internal chamber 430 of the heat exchanger 404.

The internal chamber 430 has a serpentine shape which causes the coolant's direction of flow to change one hundred eighty degrees multiple times as it flows through the winding internal chamber 430, as shown by arrows 450-454. A novel fin structure is provided in the internal chamber 430 that is absent of any ninety degree mitered corners to facilitate these changes in the coolant's direction of flow. The particulars of the novel fin structure will be described in detail below. It should be understood that the novel fin structure is designed to improve a pressure drop in the heat exchanger 404, have an increased fin density as compared to conventional fin structures, and improve a heat transfer coefficient of the heat exchanger 404. The novel fin structure is formed in the internal chamber 430 using additive manufacturing or 3D printing. Additive manufacturing and 3D printing are well known. Additive manufacturing and 3D printing allows the provision of curved fins in each bend portion 460 of the winding internal chamber 430. The curved fins facilitate a reduction in pressure drop within the heat exchanger 404. Additive manufacturing and 3D printing also allow for the mitigation of vacuum brazing capacities, a reduction in lead times, and a reduction in poor yields.

Figure 5:
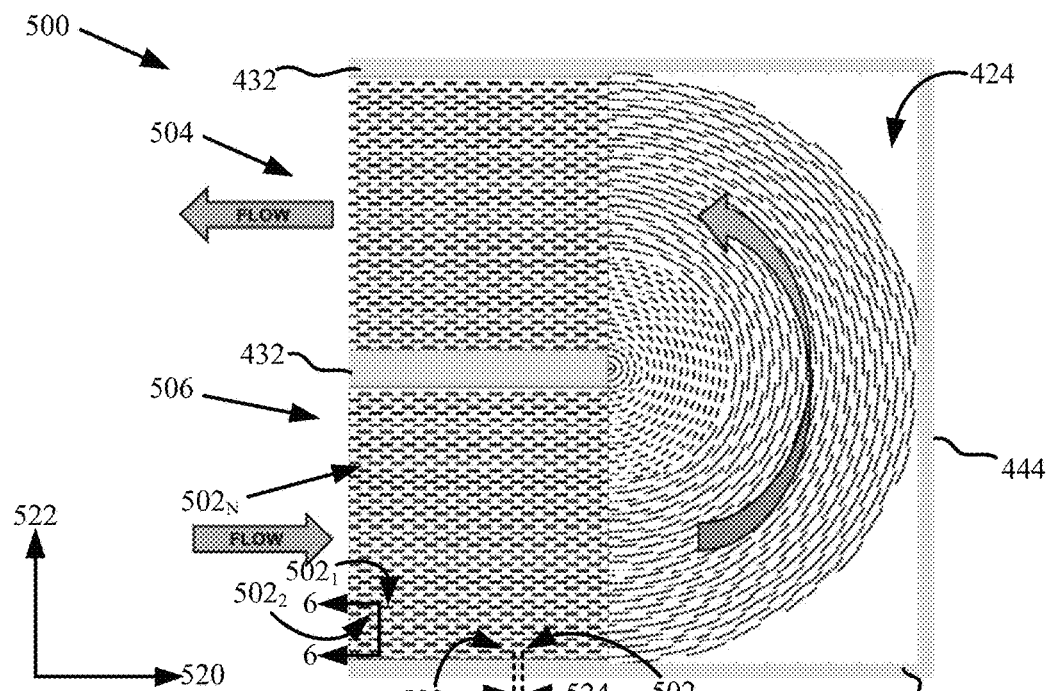
FIGS. 5-8 provide illustrations that are useful for understanding a fin structure of the heat exchanger shown in FIG. 4.
Figure 6:
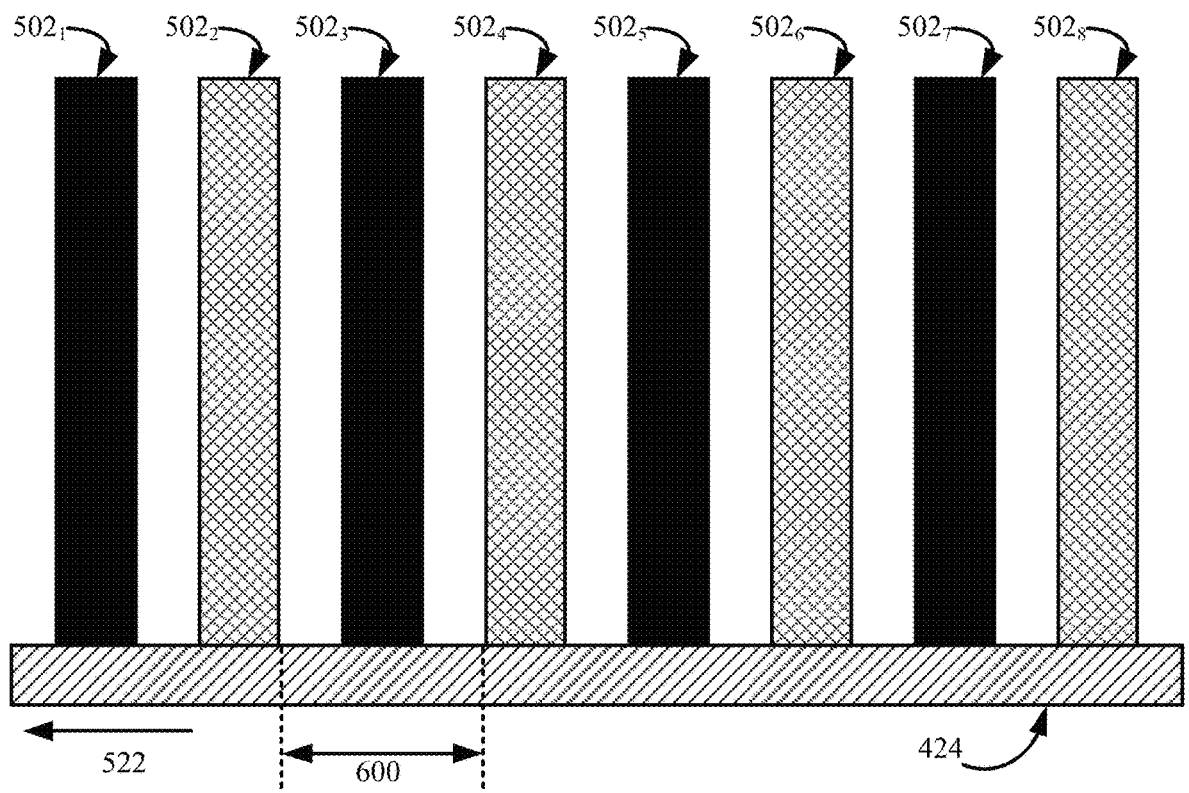
Figure 7:
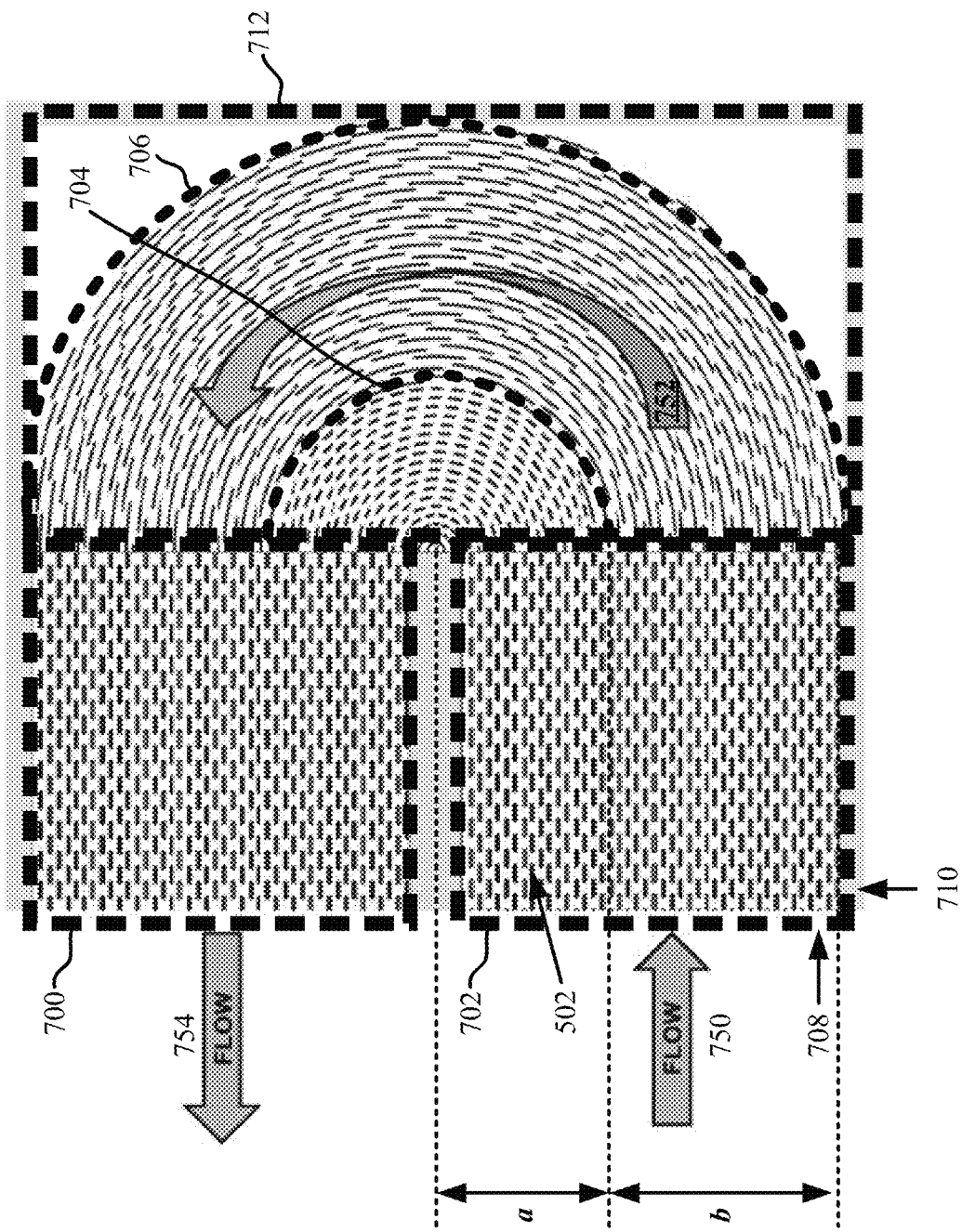
Figure 9:
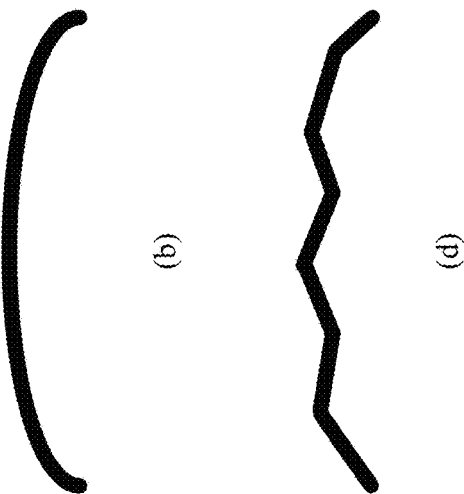
FIG. 9 provides an illustration of an illustrative cross-sectional profile for a fin.

Referring now to FIGS. 5-7, there are provided illustrations that are useful for understanding a fin structure 500 included in the internal chamber 430 of the heat exchanger 404. Cover 426 is not shown in FIGS. 5-7 simply for ease of illustration. The fin structure 500 comprises a plurality of fins $502_N$ disposed on a support structure via additive manufacturing and/or 3D printing. N is an integer. The support structure can include, but is not limited to, the bottom plate 424 of the heat exchanger 404. Each fin $502_1$, $502_2$, $502_3$, $502_4$, $502_5$, $502_6$, $502_7$, $502_8$, . . . , $502_N$ (collectively referred to as fins 502) has a generally rectangular cross-sectional profile as shown in FIG. 6. The present solution is not limited in this regard. Each fin can have a non-rectangular cross-sectional profile, such as an at least partially triangular cross-sectional profile such as that shown in FIG. 9. The fins 502 can be formed of aluminum, steel, silver, copper, gold, carbon (e.g., fiber and/or nano-tubes), diamond and/or other materials selected in accordance with a particular application.

There are four sets of fins 700, 702, 704, 706 for each pair of legs 504, 506 of the heat exchanger's internal chamber 430. First and second sets of fins 700, 702 have the same or similar fin arrangement that is selected to provide optimal heat transfer properties in respective portions of the elongate leg portions 504, 506. In accordance with this fin arrangement, the fins are disposed in a plurality of rows 708 and a plurality of columns 710. The fins in each row are spaced apart from each other (e.g., by $\frac{1}{8}^{th}$ of an inch). Similarly, the fins in each column are spaced apart from each other (e.g., by $\frac{1}{8}^{th}$ of an inch). The distance 600 between adjacent fins (e.g., fins $502_2/502_4$, fins $502_4/502_6$ and fins $502_6/502_8$) is the same in each column 710. Similarly, the distance 524 between adjacent fins (e.g., fins $502_9/502_{10}$) is the same in each row 708. The present solution is not limited in this regard. The distances 600, 524 can be variable such that (i) the distance 524 between adjacent fins varies per row or sets of rows, (ii) the distance 600 between adjacent fins varies per column or sets of columns.

Figure 10:
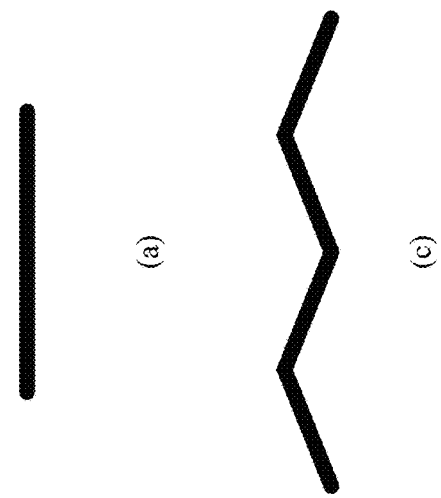
FIGS. 10(a)-10(d) (collectively referred to as "FIG. 10") provide illustrations of illustrative fin shapes.
Figure 11:
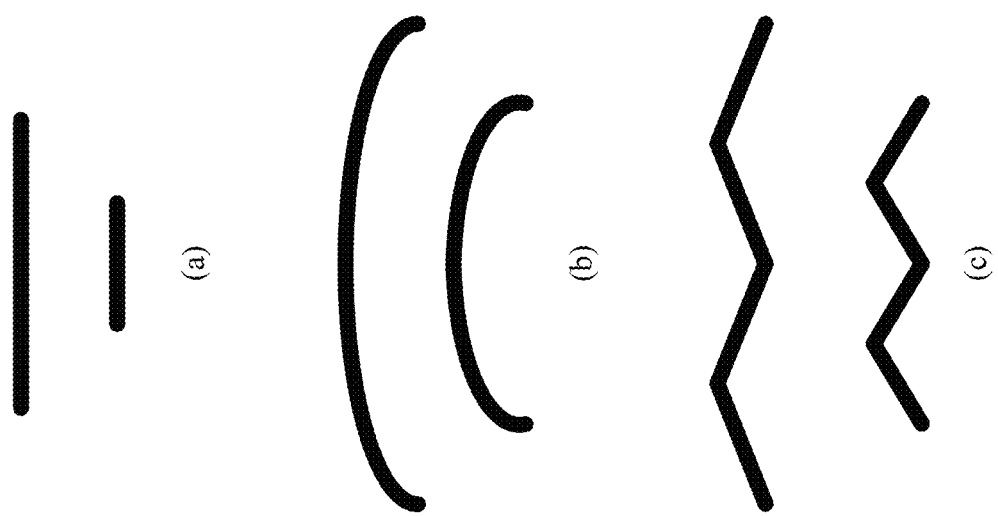
FIGS. 11(a)-11(c) (collectively referred to as "FIG. 11") provide illustrations of different fin lengths.

Fins in adjacent rows are horizontally offset from each other in direction 520 (or stated differently are offset in the x direction in a 2D plane), and fins in adjacent columns are horizontally offset from each other in direction 522 (or stated differently are offset in the y direction in a 2D plane). Direction 520 is perpendicular to direction 522. For example, fin $502_1$ is horizontally offset from fin $502_2$ in direction 522 and direction 520. In this regard, fins $502_1$ and $502_2$ entirely or at least partially reside in different rows and columns. In the latter case, at least a portion of the fin $502_1$ may overlap a portion of adjacent fin $502_2$. Each fin of sets 700, 702 can have a linear shape as shown in FIGS. 5-7 and 10(a), curved shape as shown in FIG. 10(b), a wavy shape as shown in FIG. 10(c), or a curved/wavy shape as shown in FIG. 10(d). Two or more fins of sets 700, 702 can have the same or different shapes. Also, the fins can have the same lengths as shown in FIGS. 6 and 7, or different lengths as shown in FIGS. 11(a)-11(c).

A third set of fins 704 comprises a plurality of fins arranged in concentric half circles. The radial distance between the half circles or fins is the same throughout the fin pattern of fin set 704. Each fin can have a linear shape as shown in FIGS. 6, 7 and 10(a), a curved shape as shown in FIG. 10(b), a wavy shape as shown in FIG. 10(c), or a curved/wavy shape as shown in FIG. 10(d). In some scenarios, all of the fins of set 704 have the same shape. In other scenarios, set 704 comprises a combination of at least two of linear fins, curved fins and/or wavy fins. Also the fins can have the same lengths as shown in FIGS. 6 and 7, or different lengths as shown in FIGS. 11(a)-11(c). The half circle arrangement is designed to facilitate the flow of coolant through the bend of its flow path shown by arrows 750, 752, 754 without experiencing any abrupt changes in its flow direction. Although 18 half circles are shown in FIGS. 5 and 7, the present solution is not limited in this regard. Set 704 can have fins arranged in any number of half circles selected in accordance with a particular application.

In order to facilitate optimal distribution of coolant throughout portion 752 of its flow path, the fins should have a uniform layout and a uniform density. As can be seen in FIGS. 5 and 7, the fin layout, offset and density of set 704 become non-uniform as the concentric half circles become larger. Thus, a fourth set of fins 706 has a different arrangement than the concentric half circle arrangement of the third set of fins 704. The combination of two different fin arrangements in the bend portions of the heat exchanger's chamber ensures that a pressure drop does not occur or is minimized when the coolant travels from straight portion 702 of the heat exchanger's chamber to curved portion 712 of heat exchanger's chamber and from curved portion 712 of the heat exchanger's chamber to straight portion 700 of the heat exchanger's chamber.

Figure 8:
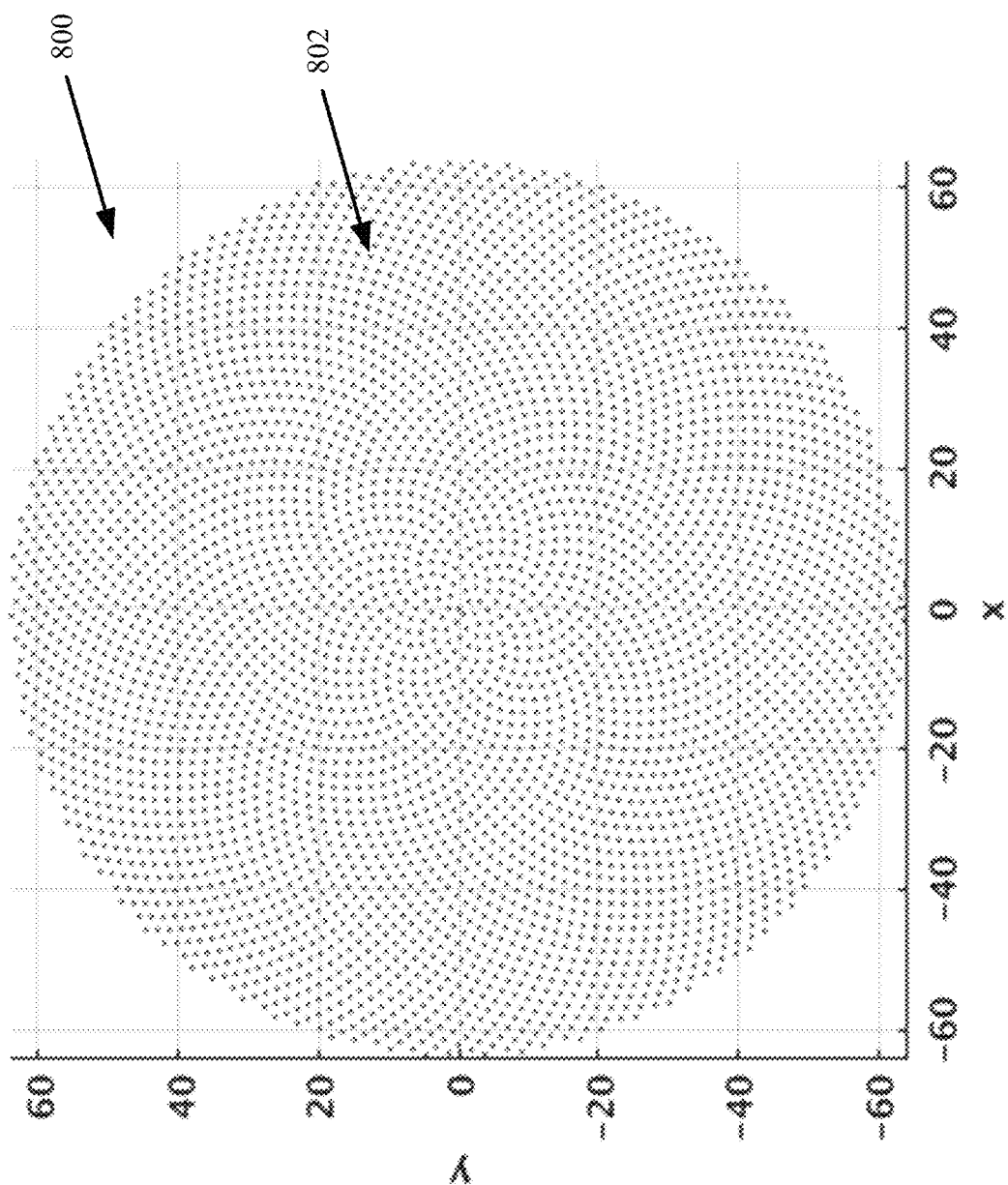

The fourth set of fins 706 comprises a plurality of fins arranged in accordance with a phyllotaxis or Fibonacci pattern. An illustrative phyllotaxis or Fibonacci pattern 800 is shown in FIG. 8. The illustrative phyllotaxis or Fibonacci pattern 800 was created using a known software program (e.g., Matlab®). The phyllotaxis or Fibonacci pattern 800 comprises dots 802 defining a plurality of phyllotactic or Fibonacci spirals in clockwise and counter-clockwise orientations. The radial distance between the dots is non-uniform or varies throughout the phyllotaxis or Fibonacci pattern. Each phyllotactic or Fibonacci spiral is based upon the Fibonacci sequence consisting of the following number: 1, 1, 2, 3, 5, 8, 13, 21, 34, 55, 89, 144, etc. The general pattern of these numbers is that each term is a sum of the previous two numbers (e.g., 1+1=2, 1+2=3, 2+3=5, 3+5=8, and so on). Successive dots in each phyllotactic or Fibonacci spiral are separated from each other by an angle that approaches 137.5°. This angle is referred to herein as the Fibonacci angle or the golden angle. In effect, the total number of clockwise spirals in the pattern is equal to a Fibonacci number (e.g., 21), and the total number of counter-clockwise spirals in the pattern is equal to the same or different Fibonacci number (e.g., 34).

Each fin of set 706 can have a curved shape as shown in FIGS. 5, 7 and 10(b), a linear shape as shown in FIG. 10(a), a wavy shape as shown in FIG. 10(c), or a curved/wavy shape as shown in FIG. 10(d). In some scenarios, all of the fins of set 706 have the same shape. In other scenarios, set 706 comprises a combination of at least two of linear fins, curved fins and wavy fins. Also, the fins can have the same lengths as shown in FIGS. 6 and 7, or different lengths as shown in FIGS. 11(a)-11(c). The shape and lengths of the fins can be selected in accordance with a given application.

Although the radial distance and spacing between the centers of adjacent fins may be non-uniform, set 706 has a nearly uniform density, i.e., sectors or bins with a fixed angular width contain approximately the same number of fin centers throughout the design. This results in a nearly even angular distribution of fin centers throughout the phyllotaxis or Fibonacci pattern. The fin centers are placed to match or in the same relative locations as respective dots of the phyllotaxis or Fibonacci pattern (e.g., the illustrative phyllotaxis or Fibonacci pattern is shown in FIG. 8). The resulting near uniformity and even distribution in fin center spacing provides an improved pressure drop and increased fin density in the portion of the internal chamber of the heat exchanger 404 covered thereby. In effect, the heat exchanger 404 has an improved thermal transfer capability as compared to conventional heat exchangers.

Figure 17:
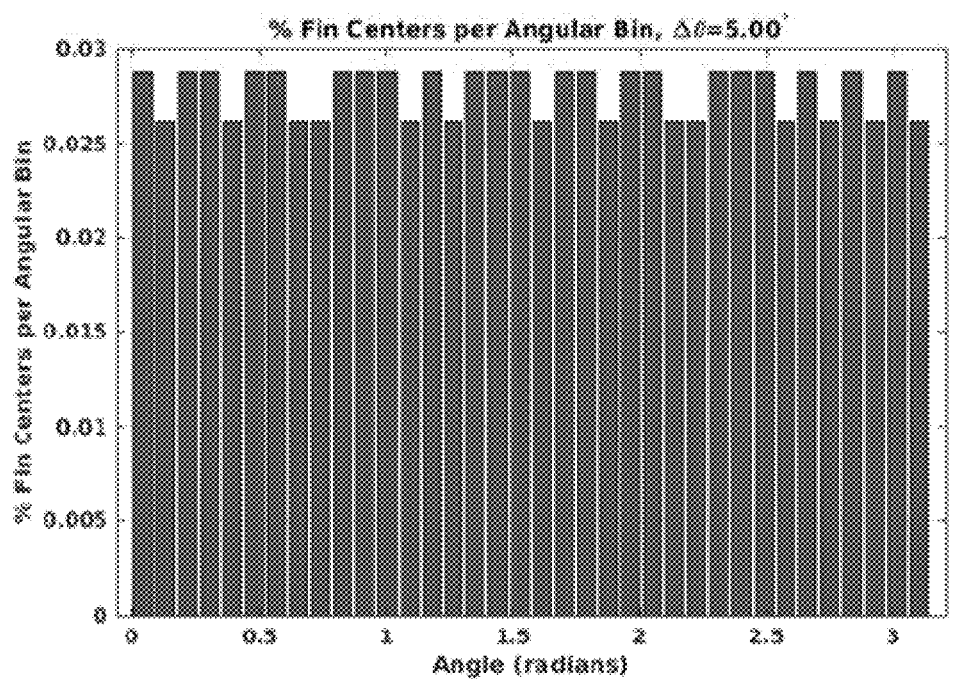
FIGS. 17(a)-(b) (collectively referred to herein as "FIG. 17") show illustrative histograms.
Figure 17:
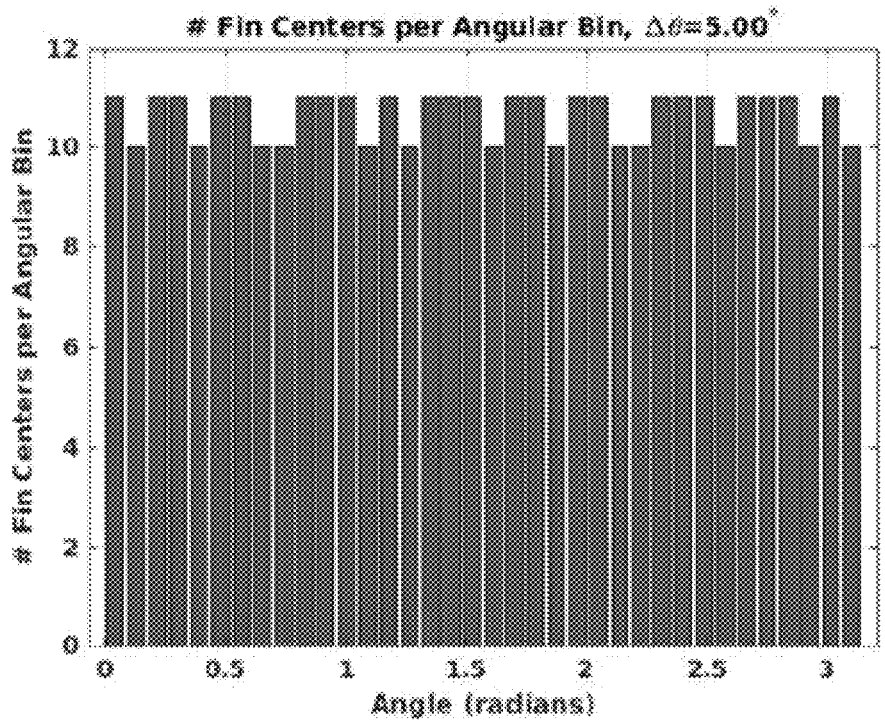

A histogram of sectors of a circle can be used to guarantee the uniform density for a Fibonacci pattern. By dividing a pattern of set 706 into even bins of a fixed angle (e.g., 5 degrees per bin), a histogram is provided that is nearly uniform with respect to the number of fin centers per bin/sector. Illustrative histograms are provided in FIG. 17.

The width a of fin set 704 and the width b of fin set 706 are selected in accordance with a given application. For example, in some scenarios, the widths a, b are selected based on the golden ratio defined be the following mathematical equation (1).

$$b/a = (1+\sqrt{5})/2 \tag{1}$$

where b represents the width 762 of set 706 and a represents the width 760 of set 704. The widths a, b may be the same or different. In some scenarios, width b is greater than width a. The present solution is not limited in this regard. The widths a, b can additionally or alternatively be selected based on other criteria such as a fin arc, a fin length, a fin height, a fin thickness, a fin offset, a fin center spacing, and/or a fin spacing.

Figure 12:
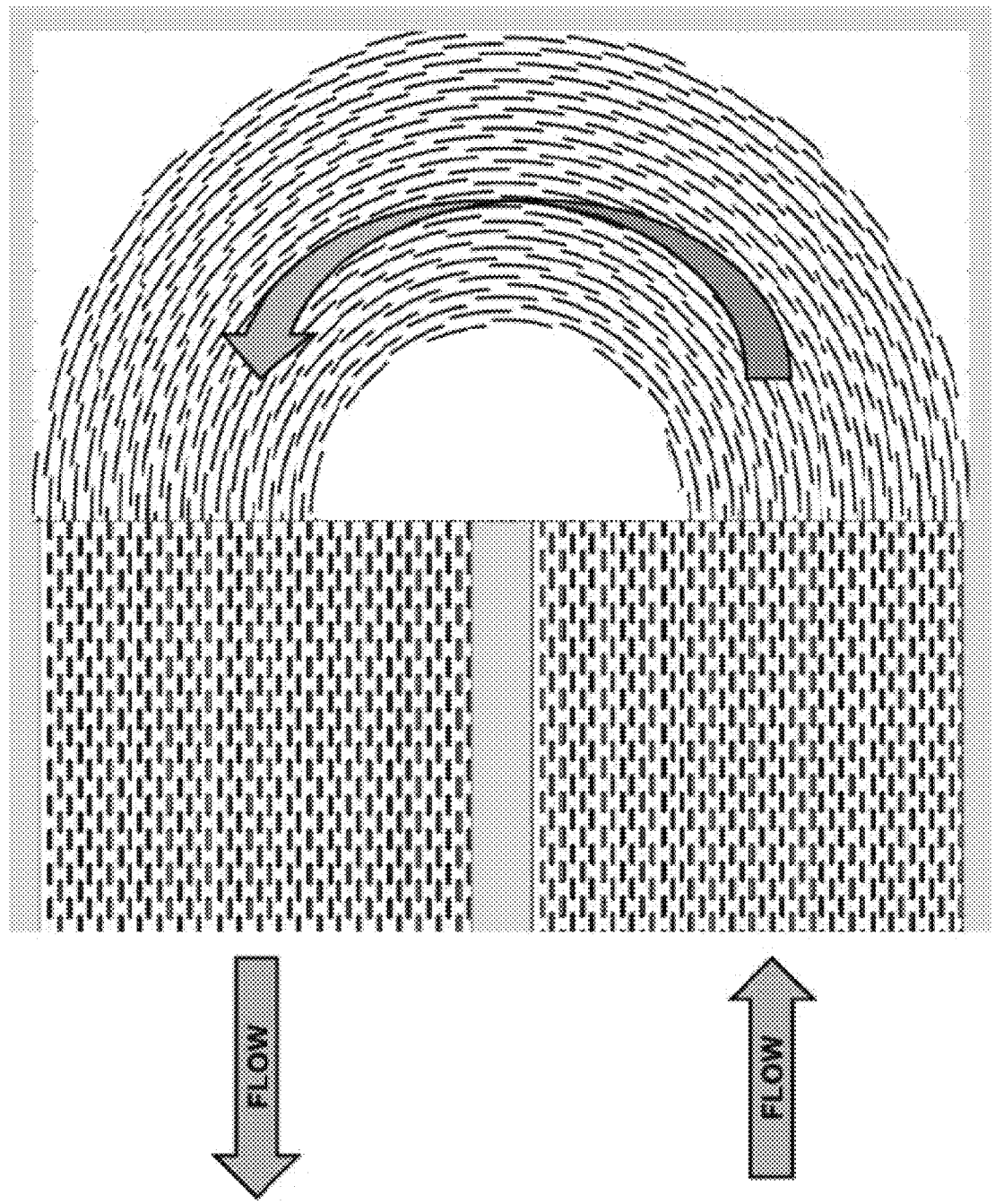
FIGS. 12 and 13 each provide an illustration that is useful for understanding another illustrative fin architecture.
Figure 13:
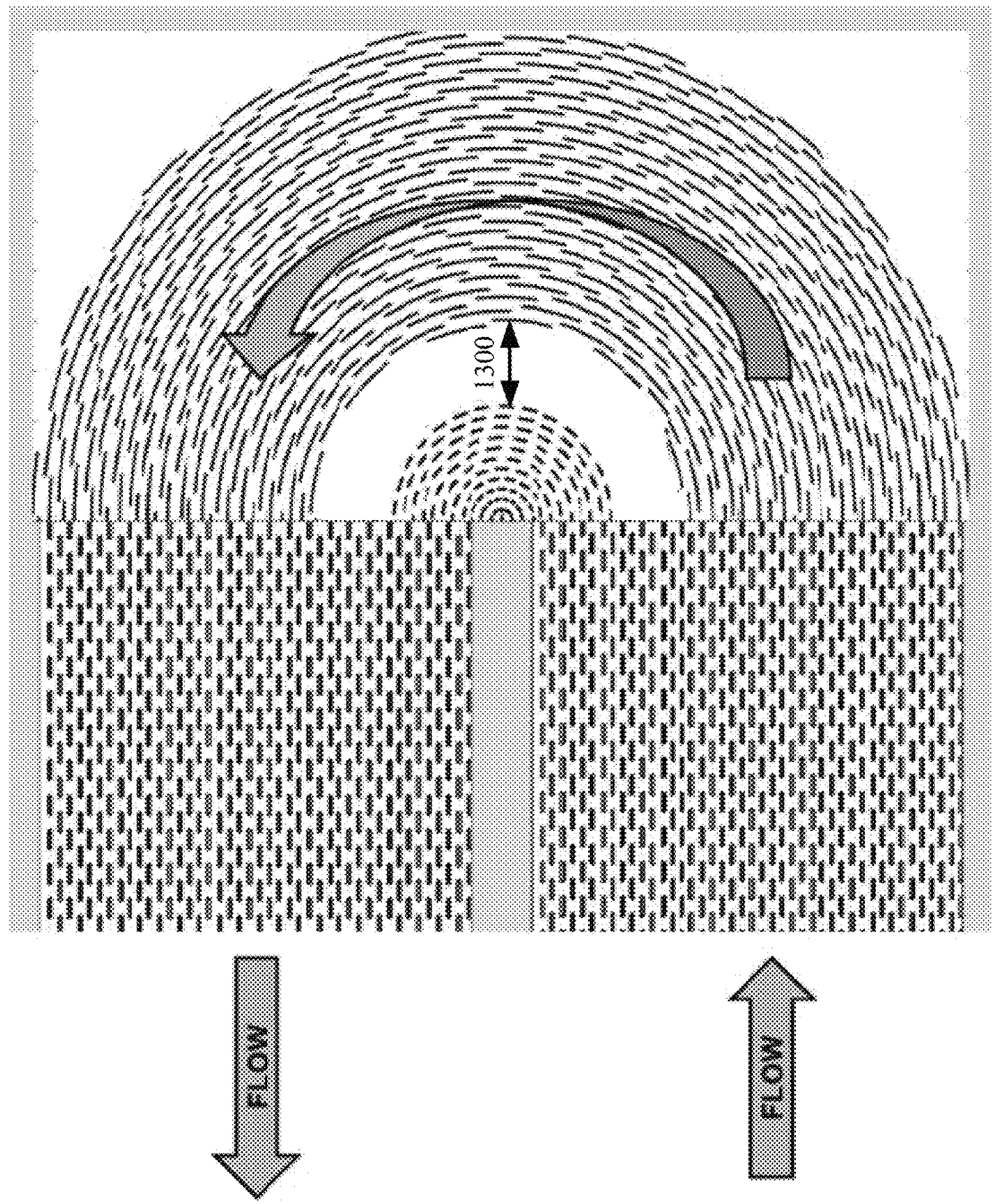
Figure 18:
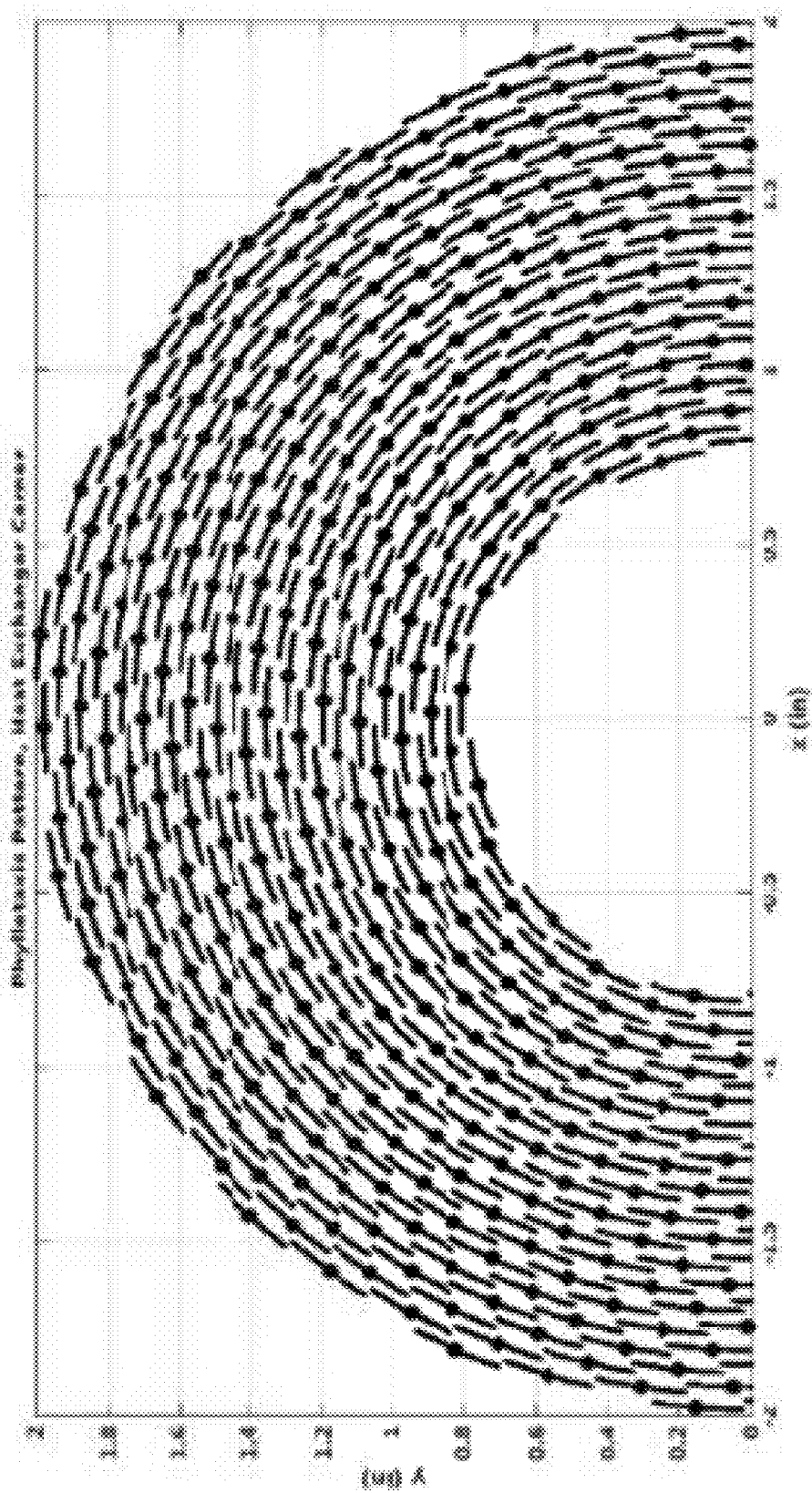
FIG. 18 provides an illustration of relatively long fins with centers arranged in a Fibonacci pattern.
Figure 19:
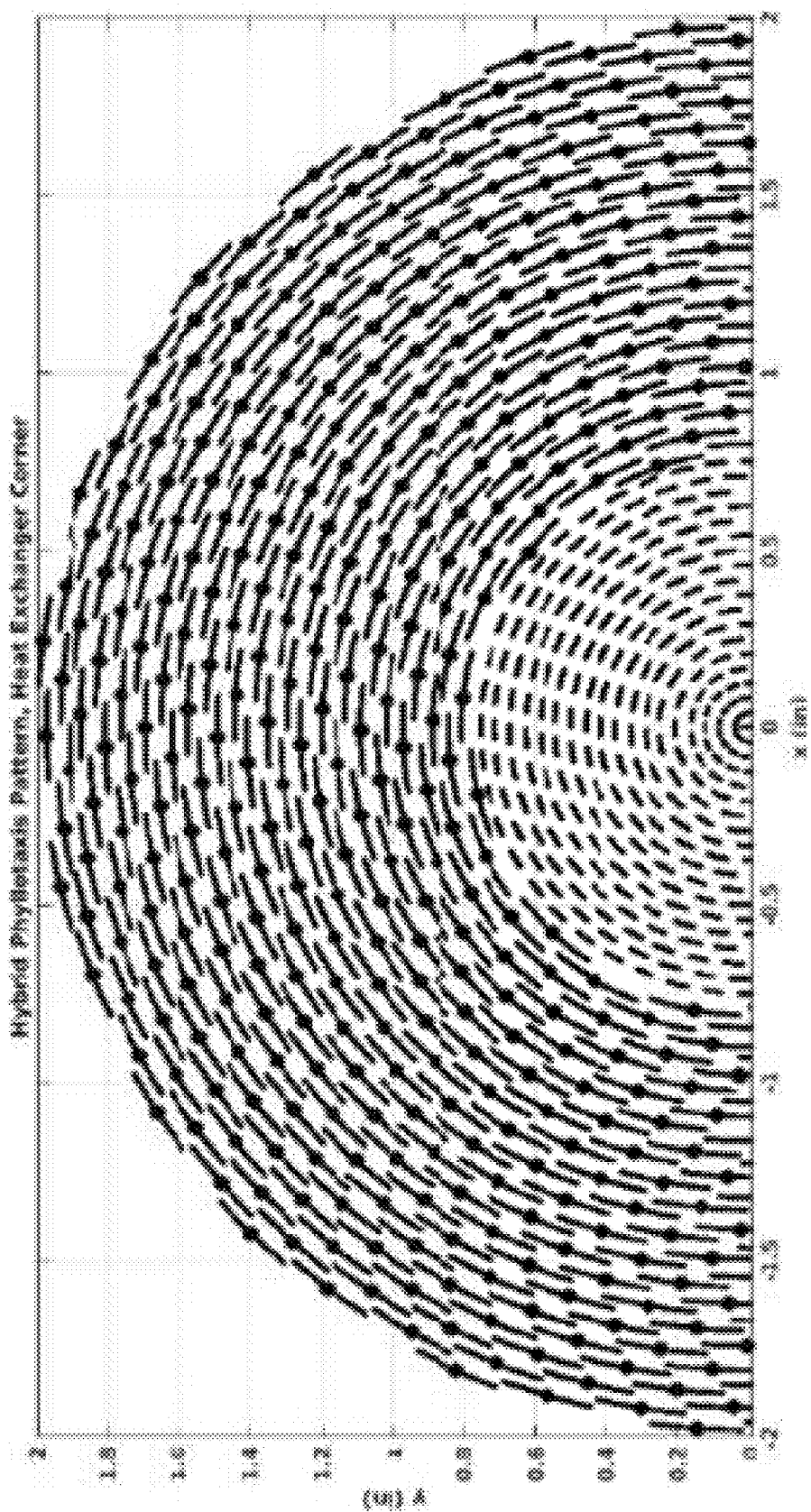
FIG. 19 provides an illustration of a set of fins with centers arranged in a Fibonacci pattern, and a set of fins with centers arranged in a concentric circle pattern.
Figure 20:
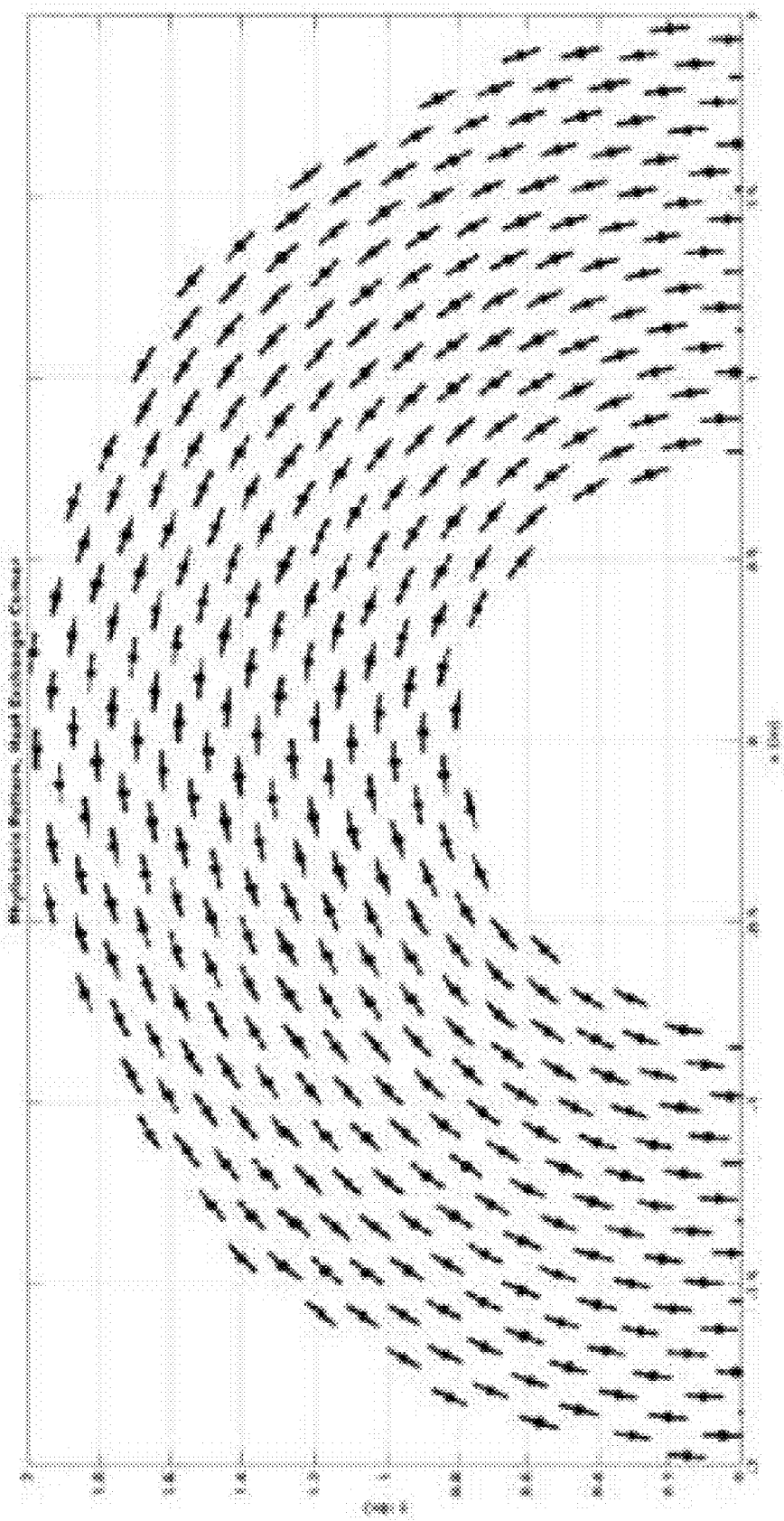
FIG. 20 provides an illustration of relatively short fins with centers arranged in a Fibonacci pattern.

The present solution is not limited to the particular fin architecture shown in FIG. 7. For example, in some scenarios, the fin structure can be absent of fin set 704 as shown in FIG. 12. In other scenarios, a gap 1300 can be provided between fin set 704 and fin set 706 as shown in FIG. 13. Additional illustrations of fin arrangements are provided in FIGS. 18-20 that are useful for understanding the present solution.

Figure 14:
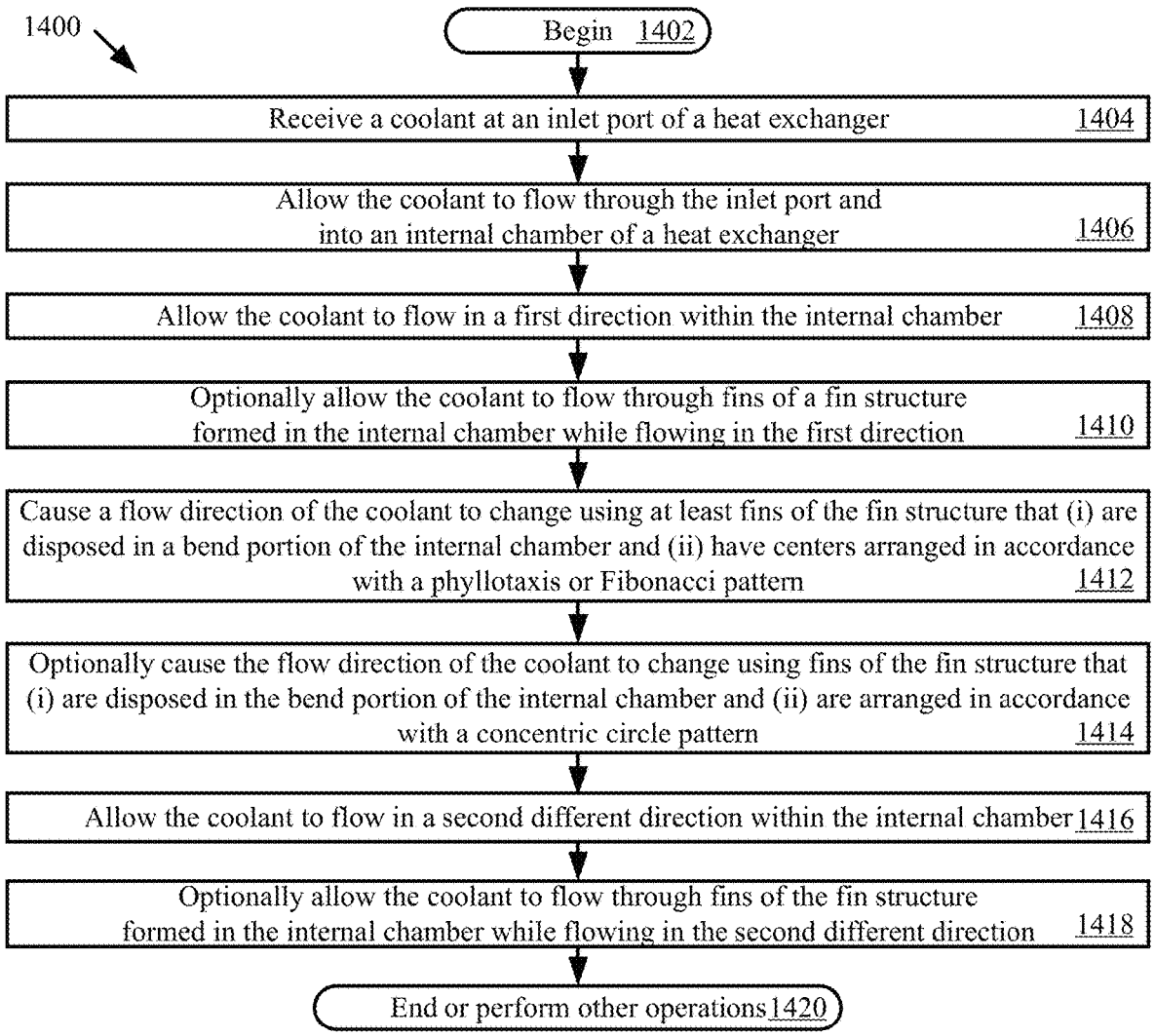
FIG. 14 provides a flow diagram of an illustrative method for operating a heat exchanger.

Referring now to FIG. 14, there is provided a flow diagram of an illustrative method 1400 for operating a heat exchanger (e.g., heat exchanger 404 of FIG. 4). Method 1400 begins with 1402 and continues with 1404 where a coolant is received at an inlet port (e.g., inlet port 446 of FIG. 4) of the heat exchanger. The coolant is allowed to flow through the inlet port and into an internal chamber (e.g., internal chamber 430 of FIG. 4) of the heat exchanger, as shown by 1406. The coolant is also allowed to flow in a first direction (e.g., direction 750 of FIG. 7) within the first chamber, as shown in FIG. 1408. In 1410, the coolant is optionally allowed to flow through fins (e.g., fins $502_N$ in set 702 of FIG. 7) of the fin structure (e.g., fin structure 500 of FIG. 5) formed in the internal chamber while flowing in the first direction. These fins may be disposed in a first elongate leg portion (e.g., leg portion 504 of FIG. 5) of the internal chamber, arranged in a plurality of rows (e.g., rows 708 of FIG. 7) and columns (e.g., columns 710 of FIG. 7), and/or be offset from each other in two directions (e.g., directions 520 and 522 of FIG. 5). The fins are formed using additive manufacturing or 3D printing.

In 1412, the flow direction of the coolant is caused to change using at least fins (e.g., fins $502_N$ in set 706 of FIG. 7) of the fin structure that (i) are disposed in a bend portion (e.g., bend portion 460 of FIG. 4) of the internal chamber and (ii) have centers arranged in accordance with a phyllotaxis or Fibonacci pattern (e.g., phyllotaxis or Fibonacci pattern 800 of FIG. 8). The fins are formed using additive manufacturing or 3D printing. The fins may comprise curved fins. Other fins (e.g., fins in set 704 of FIG. 7) of the fin structure may also optionally be used to change the flow direction of the coolant, as shown by 1414. The other fins are (i) disposed in the bend portion of the internal chamber and (ii) are arranged in accordance with a concentric circle pattern. In some scenarios, a first area of the bend portion in which the fins of 1412 are disposed is different than a second area of the bend portion in which the fins of 1414 are disposed. The first area may be larger than the second area. The sizes of the first and second areas may be selected based on, for example, a golden ratio, a fin arc, a fin length, a fin height, a fin thickness, a fin offset, a fin center spacing, and/or a fin spacing.

In 1416, the coolant is allowed to flow in a second different direction (e.g., direction 754 of FIG. 7) within the internal chamber. The coolant may optionally flow through fins (e.g., fins in set 700 of FIG. 7) of the fin structure that are formed in a second elongate leg portion (e.g., leg portion 506 of FIG. 5) of the internal chamber when the coolant flows in the second different direction, as shown by 1418. The second different direction may be opposed from the first direction. The fins are formed using additive manufacturing or 3D printing. Subsequently, 1420 is performed where method 1400 ends or other operations are performed.

Figure 15:
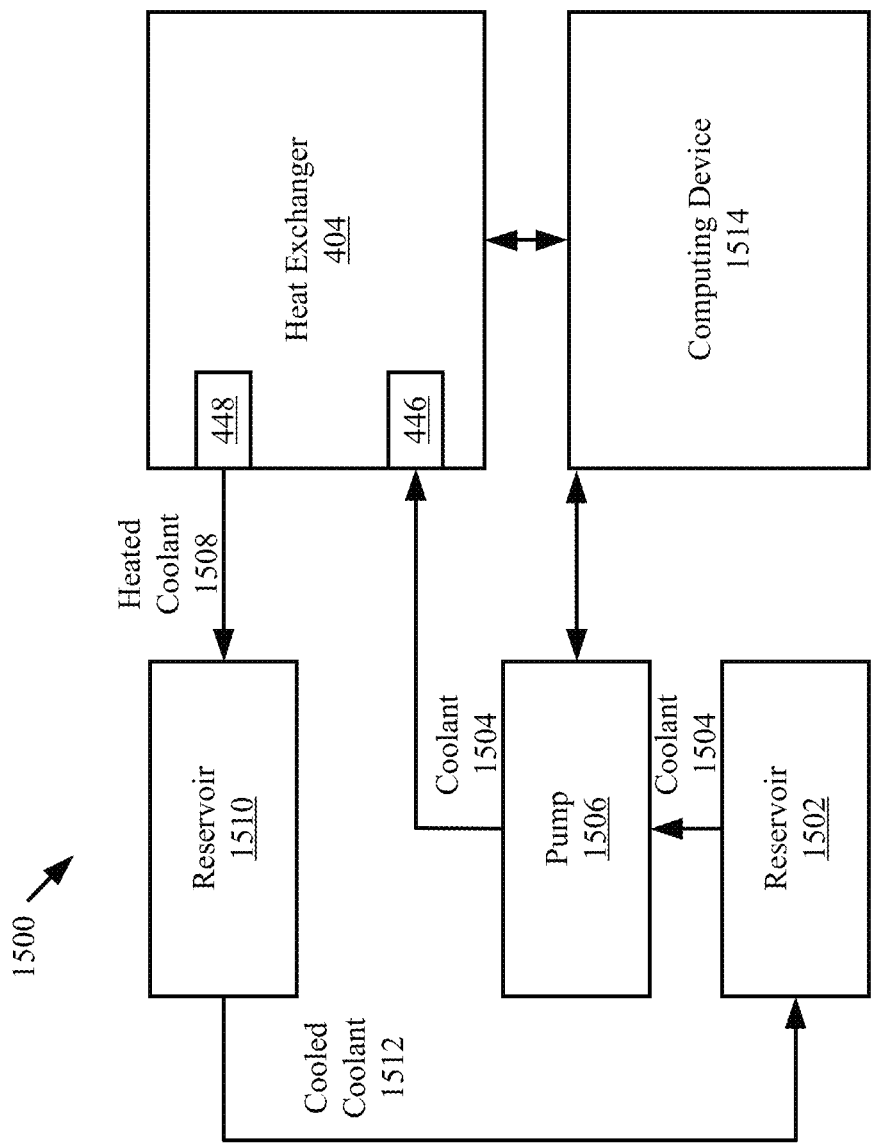
FIG. 15 provides an illustration of an illustrative system.

Referring now to FIG. 15, there is provided an illustration of an illustrative architecture of a control system for operating a heat exchanger 404 of FIG. 4. The control system is configured to implement at least a portion of method 1400 discussed above. In this regard, the control system 1500 comprises reservoirs 1502, 1510, a pump 1506, and a computing device 1514. The computing device 1514 is configured to cause the pump 1506 to pump or otherwise provide coolant 1504 to the inlet port 446 of heat exchanger 404. The coolant 1504 is heated as it flows through the heat exchanger 404. The heated coolant 1508 travels out of the outlet portion 448 of the heat exchanger 404, and into reservoir 1510 where it cools (e.g., to room temperature). Once cooled, the coolant 1512 is passed back to reservoir 1502 (e.g., via another pump not shown in FIG. 15 for ease of illustration).

The control system 1500 is shown as residing external to the heat exchanger. The present solution is not limited in this regard. One or more of the components 1502, 1506, 1510, 1514 can be integrated with and/or provided internal a housing of the heat exchanger 404. In some scenarios, the housing is defined at least partially by plate(s) 424, 426 of FIG. 4.

Figure 16:
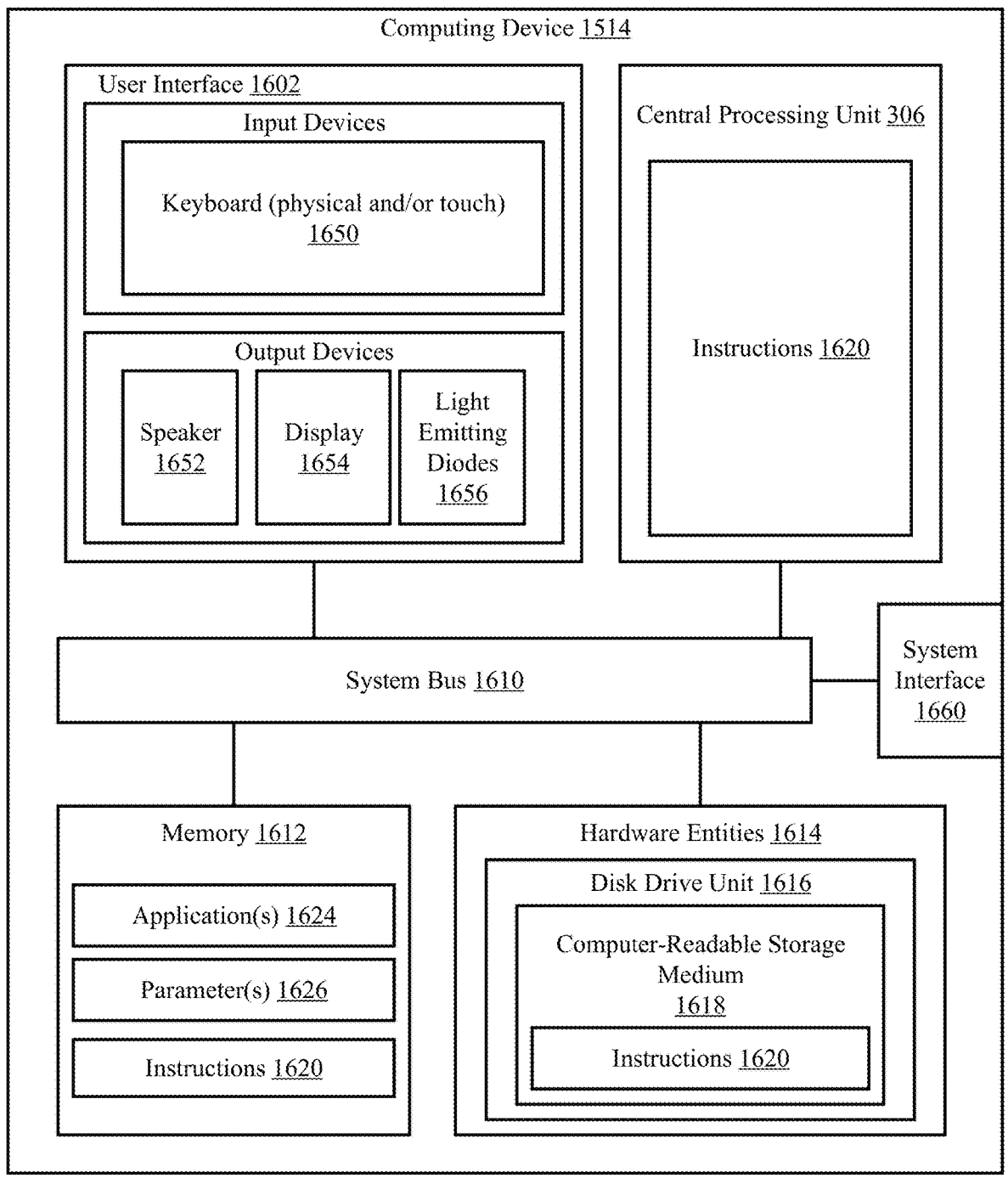
FIG. 16 provides an illustration of an illustrative architecture for a computing device.

A detailed block diagram of an illustrative architecture for computing device 1514 is provided in FIG. 16. Computing device 1514 may include more or less components than those shown in FIG. 16. However, the components shown are sufficient to disclose an illustrative solution implementing the present solution. The hardware architecture of FIG. 3 represents one implementation of a representative computing device configured to operate a heat exchanger, as described herein. As such, the computing device 1514 of FIG. 16 implements at least a portion of the method(s) described herein.

Some or all components of the computing device 1514 can be implemented as hardware, software and/or a combination of hardware and software. The hardware includes, but is not limited to, one or more electronic circuits. The electronic circuits can include, but are not limited to, passive components (e.g., resistors and capacitors) and/or active components (e.g., amplifiers and/or microprocessors). The passive and/or active components can be adapted to, arranged to and/or programmed to perform one or more of the methodologies, procedures, or functions described herein.

As shown in FIG. 16, the computing device 1514 comprises a user interface 1602, a Central Processing Unit (CPU) 1606, a system bus 1610, a memory 1612 connected to and accessible by other portions of computing device 1514 through system bus 1610, a system interface 1660, and hardware entities 1614 connected to system bus 1610. The user interface can include input devices and output devices, which facilitate user-software interactions for controlling operations of the computing device 1514. The input devices include, but are not limited to, a physical and/or touch keyboard 1650. The input devices can be connected to the computing device 1514 via a wired or wireless connection (e.g., a Bluetooth® connection). The output devices include, but are not limited to, a speaker 1652, a display 1654, and/or light emitting diodes 1656. System interface 1660 is configured to facilitate wired or wireless communications to and from external devices (e.g., network nodes such as access points, etc.).

At least some of the hardware entities 1614 perform actions involving access to and use of memory 1612, which can be a Random Access Memory (RAM), a disk drive, flash memory, a Compact Disc Read Only Memory (CD-ROM) and/or another hardware device that is capable of storing instructions and data. Hardware entities 1614 can include a disk drive unit 1616 comprising a computer-readable storage medium 1618 on which is stored one or more sets of instructions 1620 (e.g., software code) configured to implement one or more of the methodologies, procedures, or functions described herein. The instructions 1620 can also reside, completely or at least partially, within the memory 1612 and/or within the CPU 1606 during execution thereof by the computing device 1514. The memory 612 and the CPU 1606 also can constitute machine-readable media. The term "machine-readable media", as used here, refers to a single medium or multiple media (e.g., a centralized or distributed database, and/or associated caches and servers) that store the one or more sets of instructions 1620. The term "machine-readable media", as used here, also refers to any medium that is capable of storing, encoding or carrying a set of instructions 1620 for execution by the computing device V and that cause the computing device 1514 to perform any one or more of the methodologies of the present disclosure.

Although the present solution has been illustrated and described with respect to one or more implementations, equivalent alterations and modifications will occur to others skilled in the art upon the reading and understanding of this specification and the annexed drawings. In addition, while a particular feature of the present solution may have been disclosed with respect to only one of several implementations, such feature may be combined with one or more other features of the other implementations as may be desired and advantageous for any given or particular application. Thus, the breadth and scope of the present solution should not be limited by any of the above described embodiments. Rather, the scope of the present solution should be defined in accordance with the following claims and their equivalents.

What is claimed is:

1. A heat exchanger, comprising:
   a housing having an inlet port configured to receive a coolant;
   a chamber provided inside the housing and through which the coolant can flow in a first direction from the inlet port to a bend portion of the chamber; and
   a fin structure formed in the chamber and comprising first fins configured to facilitate a change in a flow direction of the coolant from the first direction to a second different direction, the first fins (i) being disposed in the bend portion of the chamber and (ii) being positioned relative to each other so that centers of the first fins at least partially define spirals of a phyllotaxis or Fibonacci pattern, wherein at least one of the first fins is angled relative to another one of the first fins.

2. The heat exchanger according to claim 1, wherein the fin structure further comprises second fins through which the coolant can flow when traveling in the first direction within a first elongate leg portion of the chamber.

3. The heat exchanger according to claim 2, where the second fins are arranged in a plurality of rows and columns.

4. The heat exchanger according to claim 3, wherein adjacent ones of the second fins are offset from each other in two directions.

5. The heat exchanger according to claim 2, wherein the coolant can flow in the second different direction through the chamber.

6. The heat exchanger according to claim 5, wherein the fin structure further comprises third fins that are formed in a second elongate leg portion of the chamber and through which the coolant can pass when flowing in the second different direction, the second different direction being opposed from the first direction.

7. The heat exchanger according to claim 1, wherein the first fins comprise curved fins.

8. The heat exchanger according to claim 1, wherein the fin structure further comprises fourth fins that (i) are disposed in the bend portion of the internal chamber, (ii) are arranged in accordance with a concentric circle pattern, and (iii) facilitate the change in the flow direction of the coolant.

9. The heat exchanger according to claim 8, wherein a first area of the bend portion in which the first fins are disposed is different than a second area of the bend portion in which the fourth fins are disposed.

10. The heat exchanger according to claim 9, wherein the first area is larger than the second area.

11. The heat exchanger according to claim 9, wherein the sizes of the first and second areas are selected based on at least one of a golden ratio, a fin arc, a fin length, a fin height, a fin thickness, a fin offset, a fin center spacing, and a fin spacing.

* * * * *